(12) United States Patent
Hou et al.

(10) Patent No.: US 10,304,732 B2
(45) Date of Patent: May 28, 2019

(54) METHODS AND APPARATUS FOR FILLING SUBSTRATE FEATURES WITH COBALT

(71) Applicant: APPLIED MATERIALS, INC., Santa Clara, CA (US)

(72) Inventors: Wenting Hou, Sunnyvale, CA (US); Jianxin Lei, Fremont, CA (US); Joung Joo Lee, San Jose, CA (US); Rong Tao, San Jose, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 0 days.

(21) Appl. No.: 15/711,169

(22) Filed: Sep. 21, 2017

(65) Prior Publication Data
US 2019/0088540 A1 Mar. 21, 2019

(51) Int. Cl.
*H01L 21/768* (2006.01)
*H01L 21/67* (2006.01)
*C23C 14/14* (2006.01)
*C23C 16/06* (2006.01)
(Continued)

(52) U.S. Cl.
CPC ........ *H01L 21/76876* (2013.01); *C23C 14/14* (2013.01); *C23C 16/06* (2013.01); *H01L 21/02697* (2013.01); *H01L 21/2855* (2013.01); *H01L 21/28562* (2013.01); *H01L 21/28568* (2013.01); *H01L 21/67167* (2013.01);
(Continued)

(58) Field of Classification Search
CPC ........... H01L 21/02697; H01L 21/2855; H01L 21/28556; H01L 21/28562; H01L 21/28568; H01L 21/67155; H01L 21/67167; H01L 21/67184; H01L 21/67207; H01L 21/76846; H01L 21/76876; H01L 21/76882; H01L 21/76883; H01L 23/53257; H01L 23/53266; C23C 14/025; C23C 14/14;
(Continued)

(56) References Cited

U.S. PATENT DOCUMENTS 8,110,489 B2 2/2012 Ganguli et al.
8,795,487 B2 8/2014 Ritchie et al.
(Continued)

FOREIGN PATENT DOCUMENTS

KR 10-2009-0103058 A 10/2009
WO WO 2007/092868 A2 8/2007

OTHER PUBLICATIONS

International Search Report and Written Opinion dated Jan. 10, 2019 for PCT Application No. PCT/US2018/051509.

*Primary Examiner* — Stephen W Smoot
(74) *Attorney, Agent, or Firm* — Moser Taboada; Alan Taboada (57) ABSTRACT

Methods and apparatus for filling features with cobalt are provided herein. In some embodiments, a method for processing a substrate includes: depositing a first cobalt layer via a chemical vapor deposition (CVD) process atop a substrate and within a feature disposed in the substrate; and at least partially filling the feature with cobalt or cobalt containing material by performing a plasma process in a physical vapor deposition (PVD) chamber having a cobalt target to reflow a portion of the first cobalt layer into the feature. The PVD chamber may be configured to simultaneously deposit cobalt or cobalt containing material within the feature from a cobalt target disposed in the PVD chamber.

17 Claims, 4 Drawing Sheets

(51) Int. Cl.
*H01L 21/285* (2006.01)
*H01L 21/02* (2006.01)
*H01L 23/532* (2006.01)

(52) U.S. Cl.
CPC .. *H01L 21/67207* (2013.01); *H01L 21/76846* (2013.01); *H01L 21/76882* (2013.01); *H01L 21/76883* (2013.01); *H01L 23/53257* (2013.01)

(58) Field of Classification Search
CPC ..... C23C 14/34; C23C 14/5806; C23C 16/06; C23C 16/56
See application file for complete search history.

(56) References Cited

U.S. PATENT DOCUMENTS

| | | |
|---|---|---|
| 9,685,371 B2 | 6/2017 | Zope et al. |
| 2004/0211665 A1* | 10/2004 | Yoon ................. H01L 21/28518 204/298.01 |
| 2008/0132050 A1* | 6/2008 | Lavoie ................ C23C 14/0084 438/584 |
| 2009/0246952 A1 | 10/2009 | Ishizaka et al. |
| 2012/0252207 A1* | 10/2012 | Lei .................... H01L 21/76885 438/653 |
| 2013/0199925 A1 | 8/2013 | Cao et al. |
| 2015/0079784 A1* | 3/2015 | Zope ...................... C23C 14/22 438/653 |
| 2016/0247718 A1 | 8/2016 | Zope et al. |
| 2017/0162448 A1* | 6/2017 | Li ....................... H01L 21/2855 |
| 2018/0174965 A1* | 6/2018 | Kamineni ......... H01L 21/76882 |
| 2018/0211872 A1* | 7/2018 | Wu .................. H01L 21/76846 |

\* cited by examiner

METHODS AND APPARATUS FOR FILLING SUBSTRATE FEATURES WITH COBALT

FIELD

Embodiments of the present disclosure generally relate to the field of semiconductor manufacturing processes, more particularly, to methods for depositing cobalt containing layers in features of a semiconductor substrate.

BACKGROUND

Cobalt is one candidate for a new material solution for both contact and BEOL (back end of the line) interconnect fill applications in 10/7 nm nodes. Tungsten (W) contacts include a titanium (Ti)/titanium nitride (TiN) barrier which the inventors have observed is problematic as the Ti/TiN barrier increases interface resistance and limits downward scaling of features (e.g., interconnects). Additionally, the inventors have observed copper (Cu) vias are problematic when a barrier/liner increases interface resistance and negatively impacts via resistance scaling.

Further, the inventors have observed that conformal cobalt fill by chemical vapor deposition (CVD) often undesirably results in voids embedded into the feature, and forms micro-voids. Even using an aggressive anneal process (e.g., higher temperatures and longer anneal times), the micro-voids are difficult to remove and may undesirably remain in the feature. Moreover, the BEOL process includes limited anneal temperatures to protect the dielectric materials on the substrate.

Accordingly, the inventors have provided an improved method for filling substrate features with cobalt.

SUMMARY

Methods and apparatus for filling features with cobalt are provided herein. In some embodiments, a method for processing a substrate includes: depositing a first cobalt layer via a chemical vapor deposition (CVD) process atop a substrate and within a feature disposed in the substrate; and at least partially filling the feature with cobalt by performing a plasma process in a physical vapor deposition (PVD) chamber having a cobalt target to reflow a portion of the first cobalt layer into the feature. In embodiments, performing a plasma process in a physical vapor deposition (PVD) chamber to reflow a portion of the first cobalt layer into the feature includes simultaneously depositing cobalt within the feature from a cobalt target disposed in the PVD chamber.

Optionally, embodiments may include depositing an underlayer within the feature prior to depositing the first cobalt layer, and depositing the first cobalt layer directly atop the underlayer.

In some embodiments, a method for processing a substrate includes: depositing an underlayer within a feature disposed in a substrate; depositing a first cobalt layer via a chemical vapor deposition (CVD) process atop the substrate and directly atop the underlayer; partially filling the feature with cobalt by performing a plasma process in a physical vapor deposition (PVD) chamber to reflow a portion of the first cobalt layer into the feature; and subsequently depositing a second cobalt layer via a CVD process to completely fill the feature. In embodiments, performing a plasma process in a physical vapor deposition (PVD) chamber to reflow a portion of the first cobalt layer into the feature includes simultaneously depositing cobalt within the feature from a cobalt target disposed in the PVD chamber.

In some embodiments, an apparatus for film deposition on a substrate includes: a central vacuum transfer chamber; a chemical vapor deposition (CVD) process chamber configured to deposit titanium nitride and coupled to the central vacuum transfer chamber; a chemical vapor deposition (CVD) process chamber configured to deposit cobalt and coupled to the central vacuum transfer chamber; and a physical vapor deposition (PVD) chamber configured to deposit cobalt and coupled to the central vacuum transfer chamber. In embodiments, the PVD chamber is configured to perform a plasma process in a physical vapor deposition (PVD) chamber to reflow a portion of a first cobalt layer into the feature while simultaneously depositing cobalt within the feature from a cobalt target disposed in the PVD chamber.

Other and further embodiments of the present disclosure are described below.

BRIEF DESCRIPTION OF THE DRAWINGS

Embodiments of the present disclosure, briefly summarized above and discussed in greater detail below, can be understood by reference to the illustrative embodiments of the disclosure depicted in the appended drawings. However, the appended drawings illustrate only typical embodiments of the disclosure and are therefore not to be considered limiting of scope, for the disclosure may admit to other equally effective embodiments.

To facilitate understanding, identical reference numerals have been used, where possible, to designate identical elements that are common to the figures. The figures are not drawn to scale and may be simplified for clarity. Elements and features of one embodiment may be beneficially incorporated in other embodiments without further recitation.

DETAILED DESCRIPTION

Embodiments of the present disclosure provide methods for processing a substrate that provide improved feature fill when processing a substrate including one or more metal filled features.

The inventors have observed that cobalt deposited within a feature advantageously shows larger grain, lower resistivity, and better roughness via a metal fill process in accordance with the present disclosure. Moreover, cobalt (Co) fill in accordance with the present disclosure yields about 5 to about 8 times lower metal line resistance than tungsten for contact applications, and >45% via resistance reduction as compared to copper fill for interconnect application at the 7 nm node. CVD processes are combined with PVD processes in accordance with the present disclosure to produce a high quality metal filled feature. In embodiments, cobalt is deposited in at least one feature on a substrate using a CVD process and then moved to a PVD chamber where a process is performed to increase the cobalt's density and purity, while decreasing the cobalt's resistivity. In embodiments, the PVD process is a PVD process performed in a heated environment, as described in more detail below. The processes can be performed with or without a vacuum break between processes.

Figure 1:
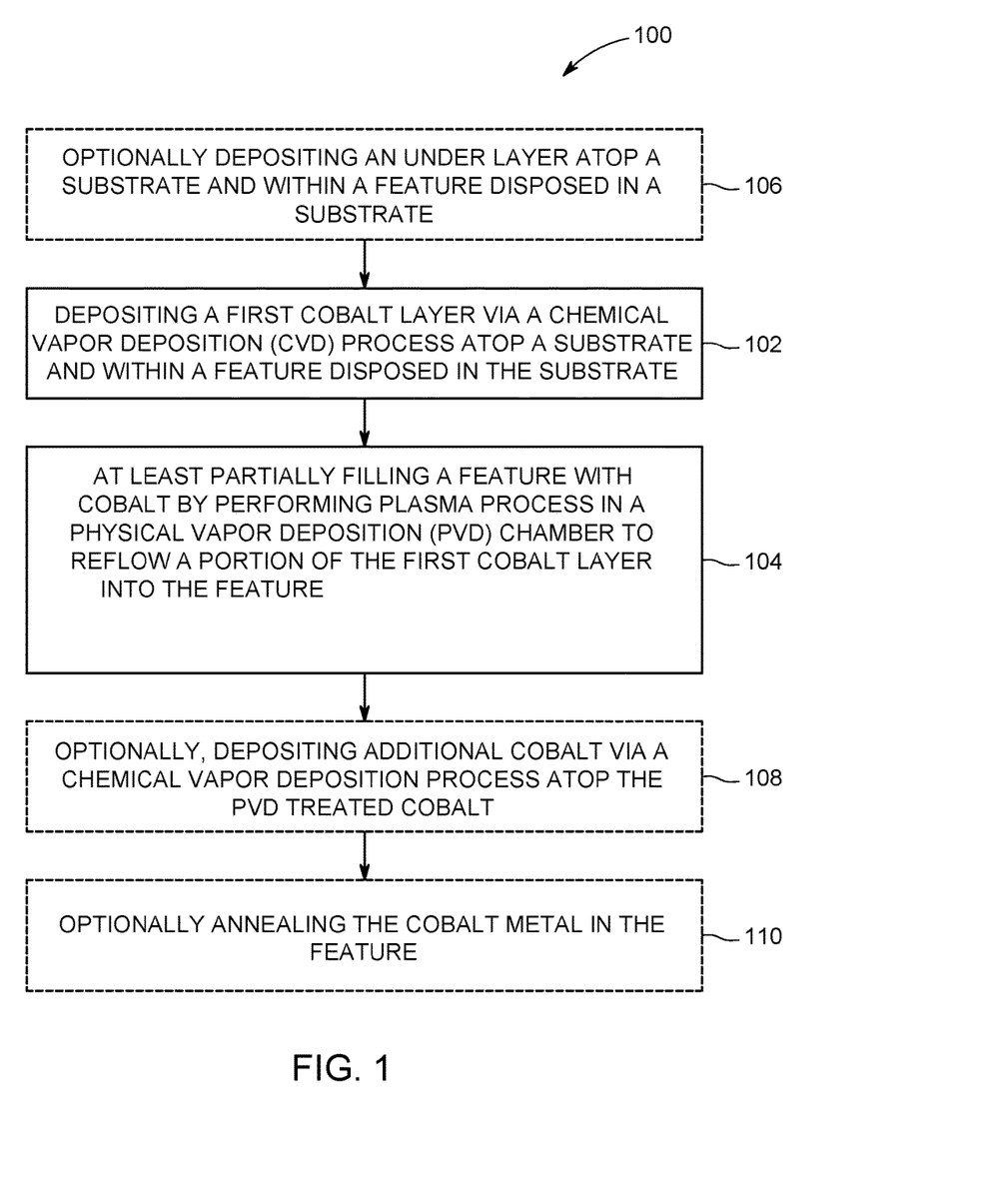
FIG. 1 depicts a flow diagram of a method for depositing cobalt metal in a feature of a semiconductor device in accordance with embodiments of the present disclosure.

FIG. 1 is a flow diagram of a method 100 for processing a substrate in accordance with some embodiments of the present disclosure. The method 100 is described below with respect to the stages of processing a substrate as depicted in FIGS. 2A-2F and may be performed, for example, in a suitable cluster tool and process chambers, such as described below with respect to FIG. 3. Exemplary processing systems that may be used to perform the methods disclosed herein may include, but are not limited to, any of the ENDURA®, CENTURA®, or PRODUCER® brand processing systems, commercially available from Applied Materials, Inc., of Santa Clara, Calif. Other process chambers, including ones available from other manufacturers, may also be suitably used in connection with the teachings provided herein.

Figure 2A:
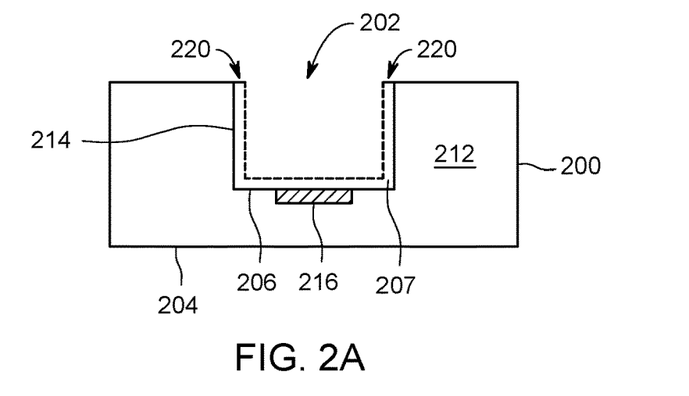
FIGS. 2A-2F respectively depict stages of fabrication of depositing metal in features of a semiconductor device in accordance with embodiments of FIG. 1 of the present disclosure.
Figure 2B:
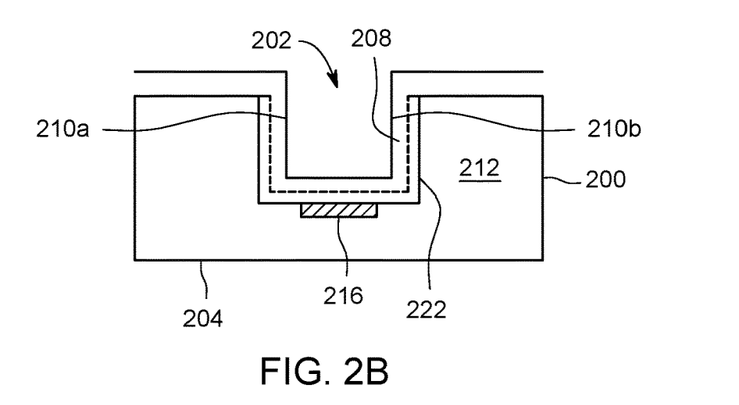

The method 100 is typically performed on a substrate 200 provided to a processing volume of a process chamber, for example substrate processing chamber 314 and substrate processing chamber 338 described below with respect to FIG. 3. In some embodiments, as shown in FIG. 2A, the substrate 200 includes one or more features 202 (one shown in FIGS. 2A-F) to be filled, formed in a layer 212 of the substrate 200, and extending towards a base 204 of the substrate 200. Although the following description is made with respect to one feature 202, the substrate 200 may include any number of features 202 (such as vias, trenches, or the like) as described below.

The substrate 200 may be any suitable substrate having the feature 202 formed in the substrate 200 or layer 212. For example, the substrate 200 may include one or more of silicon (Si), silicon oxide ($SiO_2$), or the like. In embodiments, the substrate 200 may include feature 202 formed in a dielectric layer. For example, a low-k material (e.g., a material having a dielectric constant less than silicon oxide, or less than about 3.9), or the like. In some embodiments, layer 212 may be disposed atop a second dielectric layer (not shown), such as silicon oxide, silicon nitride, silicon carbide, or the like.

In addition, the substrate 200 may include additional layers of materials or may have one or more completed or partially completed structures or devices formed in or on the substrate 200. In some embodiments, a layer 216, such as a logic device or the like, or a portion of a device requiring electrical connectivity, such as a gate, a contact pad, a cobalt pad, a conductive line or via, or the like, may be disposed in the base 204 of the substrate 200 and aligned with the feature 202. For example, the feature 202 may be filled with a conductive material to form a conductive pathway to the layer 216. As used herein, the layer 216 need not be a continuous structure extending across an entire surface of the substrate, but can be a smaller component, such as a device, partial device, conductive pathway, or the like.

In embodiments, the substrate 200 may be, for example, a doped or undoped silicon substrate, a III-V compound substrate, a silicon germanium (SiGe) substrate, an epi-substrate, a silicon-on-insulator (SOI) substrate, a display substrate such as a liquid crystal display (LCD), a plasma display, an electro luminescence (EL) lamp display, a light emitting diode (LED) substrate, a solar cell array, solar panel, or the like. In some embodiments, the substrate 200 may be a semiconductor wafer.

The substrate 200 is not limited to any particular size or shape. The substrate 200 can be a round wafer having a 200 mm diameter, a 300 mm diameter or other diameters, such as 450 mm, among others. The substrate can also be any polygonal, square, rectangular, curved or otherwise non-circular workpiece, such as a polygonal glass substrate used in the fabrication of flat panel displays.

The feature 202 may be formed by etching the substrate 200 using any suitable etch process. In some embodiments, the feature 202 is defined by one or more sidewalls 214, a bottom surface 206 and upper corners 220. In some embodiments, the feature 202 may be a via, trench, dual damascene, or the like. In some embodiments, the feature 202 may have a high aspect ratio, e.g., an aspect ratio between about of about 5:1 and about 15:1. As used herein, the aspect ratio is the ratio of a depth of the feature to a width of the feature. In embodiments, the feature 202 has a width less than or equal to 15 nm.

Referring to FIG. 1 (106 shown in phantom), and FIGS. 2A-2F, an underlayer 207 (shown in phantom) may optionally be deposited on substrate 200 and within feature 202 in a process chamber configured to deposit a layer (e.g., substrate processing chambers 312, 314 discussed below). The underlayer 207 can be a layer conformably formed along at least a portion of the sidewalls and/or lower surface of a feature such that a substantial portion of the feature prior to the deposition of the layer remains unfilled after deposition of the layer. In some embodiments, the underlayer 207 may be formed along the entirety of the sidewalls 214 and bottom surface 206 of the feature 202. The underlayer 207 may be a wetting layer provided to enhance the adherence of a metal layer disposed upon the underlayer 207.

In some embodiments, the underlayer 207 has a thickness of about 2 angstroms to about 100 angstroms, or about 2 angstroms to about 20 angstroms. In some embodiments, the underlayer 207 is a metal containing layer. For example, in some embodiments, the underlayer 207 may contain, or may predominantly contain, tungsten (W), aluminum (Al), titanium (Ti), tantalum (Ta), oxides or nitrides thereof, silicides thereof, derivatives thereof, or combinations thereof. In some embodiments, the underlayer 207 is a metal or a metal nitride material, such as titanium (Ti), titanium nitride (TiN), alloys thereof, or combinations thereof. In embodiments, underlayer 207 comprises or consists of titanium nitride (TiN). In some embodiments, the underlayer 207 may be deposited by a chemical vapor deposition (CVD) chamber or an atomic layer deposition (ALD) chamber, such as any of substrate processing chambers 312, 314, described below with respect to FIG. 3. For example, in some embodiments, the underlayer 207 has a thickness of about 2 angstroms to about 100 angstroms, or about 2 angstroms to about 5 angstroms, and is deposited by ALD or CVD. In some embodiments, the underlayer 207 is titanium nitride (TiN) having a thickness of about 2 angstroms to about 100 angstroms, or about 2 angstroms to about 5 angstroms, deposited by CVD or ALD.

Next, at 102, a first cobalt layer 208 is deposited atop the underlayer 207 on the substrate 200 and in the feature 202 in a first process chamber. Alternatively, in embodiments where the optional underlayer 207 is not deposited, the method may begin at 102 by depositing the first cobalt layer 208 on the substrate 200 and in the feature 202 in the first process chamber. The first cobalt layer 208 may comprise or consist of pure cobalt. In embodiments, first cobalt layer 208 includes cobalt or a cobalt alloy. For example, useful cobalt alloys include cobalt-tungsten alloys, cobalt-phosphorus alloys, cobalt-tin alloys, cobalt-boron alloys, and ternary alloys, such as cobalt-tungsten-phosphorus and cobalt-tungsten-boron. The first cobalt layer 208 may also include, however, other metals, metal alloys, and dopants, such as nickel, tin, titanium, tantalum, tungsten, molybdenum, platinum, iron, niobium, palladium, nickel cobalt alloys, doped cobalt, and combinations thereof. In embodiments, the cobalt and cobalt-containing material of the first cobalt layer 208 is substantially pure cobalt, or cobalt with no more than 5% impurities. In embodiments, the first cobalt layer is a cobalt material having no more than 5% of other metal therein.

In some embodiments, as shown in FIG. 2B, the first cobalt layer 208 is deposited atop a first surface 222 of the substrate 200 and within the feature 202 formed in the first surface 222. The first cobalt layer 208 may be deposited using any suitable CVD deposition process(es). Non-limiting examples of CVD processes suitable for deposition of the first cobalt layer 208 are disclosed in commonly-owned U.S. Pat. No. 8,110,489, issued Feb. 7, 2012 to Ganguli, et al. In some embodiments, the first cobalt layer 208 is a conductive cobalt material used to fill the feature 202, for example, to form a conductive pathway. In some embodiments, the first cobalt layer 208 is deposited via a CVD process using suitable cobalt precursors for forming cobalt-containing materials such as those described in commonly-owned U.S. Pat. No. 8,110,489, issued Feb. 7, 2012 to Ganguli, et al., U.S. Pat. No. 9,051,641, issued Jun. 19, 2015 to Lu, et al., and U.S. Pat. No. 9,685,371, issued Jun. 20, 2017 to Zope, et al.

In some embodiments, the thickness of the first cobalt layer 208 is predetermined such as about 20 angstroms to about 150 angstroms, or about 50 angstroms to about 150 angstroms. In embodiments, the shape of the first cobalt layer 208 is substantially uniform and conformal as generally shown in FIGS. 2A-2E, however variation may occur and non-conformal gap shapes may form in feature 202. In some embodiments, the first cobalt layer 208 may optionally be formed directly atop the entirety of the sidewalls 214 and bottom surface 206 of the feature 202. In embodiments, the first cobalt layer 208 may be formed directly atop underlayer 207 disposed atop sidewalls 214 and bottom surface 206 of the feature 202.

Figure 2C:
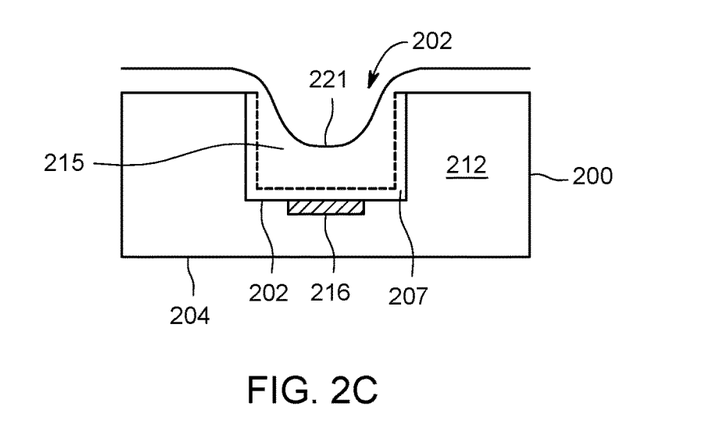
Figure 2D:
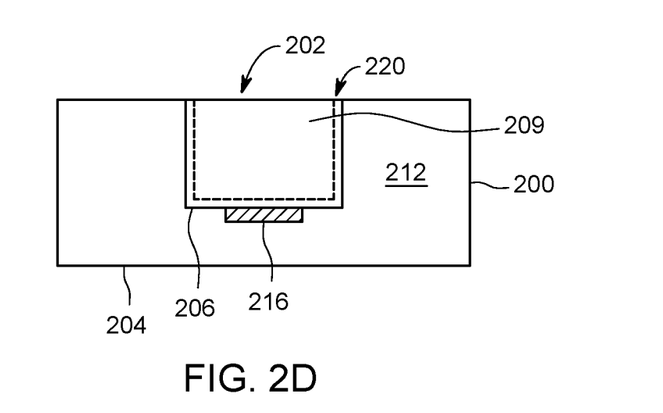
Figure 3:
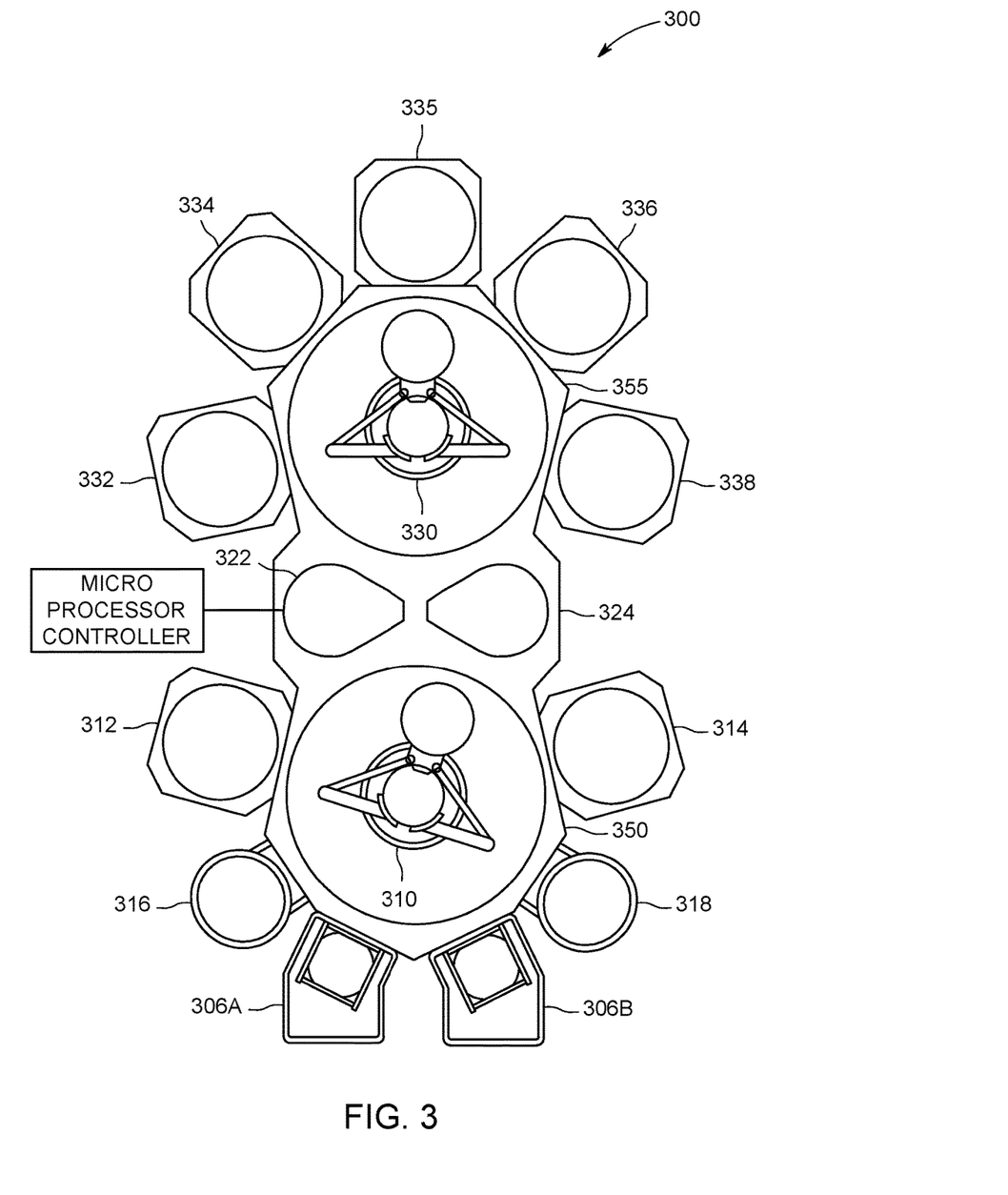
FIG. 3 depicts a cluster tool suitable to perform methods for processing a substrate in accordance with some embodiments of the present disclosure.

At 104 and FIG. 2C, feature 202 is at least partially filled with cobalt by performing a plasma process in a physical vapor deposition (PVD) chamber to reflow a portion of the first cobalt layer 208 into the feature 202. For example, the PVD process reflows a portion of inner layer 210a and 210b (depicted in FIG. 2B) to form at least a partially filled feature 202 in area 215. For example, feature 202 may be about 20% to 95% filled, about 30% to about 85% filled, about 40-60% filled, or at least about 25%, at least about 50% or at least about 75% filled by performing a plasma process in a physical vapor deposition (PVD) which deposits from bottom surface 206 of feature 202 towards the upper corners 220. Non-limiting examples of a partially filled features include one or more feature(s) that are at least 50%, 60%, 70%, 75%, 80%, 90%, 95%, 96%, 97%, 98% or 99% filled from bottom to top, but not 100% filled, using a PVD treatment in accordance with the present disclosure. In some embodiments, and as shown in FIG. 2D, feature 202 may be fully filled with cobalt from the bottom surface 206 of feature 202 to the upper corners 220 and/or above the upper corners 220 using a PVD treatment in accordance with the present disclosure.

In some embodiments, the process is performed in a second process chamber 332, or 338 (FIG. 3), which can be any PVD chamber configured to deposit cobalt and cobalt-containing material in the manner as disclosed herein. One exemplary PVD processing system suitable for modification in accordance with the teachings herein and for performing the above process is the ENDURA® Cirrus™ HTX PVD system, commercially available from Applied Materials, Inc., of Santa Clara, Calif. In embodiments, suitable PVD chambers include those described in U.S. Pat. No. 8,795,487, issued Aug. 5, 2014 to Ritchie, et al., and U.S. Patent Publication Number 2002/0144889, published Oct. 10, 2002 to Rong Tao, et al.

To perform the deposition process to reflow the first cobalt layer 208, RF and DC power is provided to a cobalt or cobalt containing target disposed within a PVD process chamber. About 0.25 to about 6 kilowatts of RF energy may be provided to the target at a frequency of from about 13 to about 60 MHz, or 27 to about 40 MHz, or about 40 MHz. In embodiments, about 0.5 to 5.0 kilowatts of DC power is provided to the cobalt or cobalt containing target.

In addition, the PVD process chamber is maintained at a pressure of about 4 mTorr to about 150 mTorr, or about 10 mTorr to about 150 mTorr. About 0.1 W to 310 W, for example at least about 300 W, of RF bias power may be provided to the substrate support at a frequency of about 5 to about 30 MHz, or about 10 to about 15 MHz, or about 13.56 MHz.

The PVD process includes suitable gases to facilitate the reflow process. A gas source may provide a suitable gas species such as an inert gas, such as argon, krypton, neon, or the like, hydrogen ($H_2$), or combinations thereof. In some embodiments, the plasma process includes a plasma formed from hydrogen or an inert gas. In some embodiments, only $H_2$ gas is provided.

Still referring to a process to reflow the first cobalt layer 208, the plasma processing chamber may include a high temperature heater, suitable for heating the substrate to a temperature of about 350° C. to about 500° C. or about 350° C. to about 450° C.

In some embodiments, target atoms strike the substrate. A deposition rate in an amount of 0.1-10 angstroms/sec. is suitable for use in accordance with the present disclosure. Accordingly, the physical vapor deposition chamber may be configured to apply a cobalt deposition rate in an amount of 0.1-10 angstroms/sec.

Figure 2E:
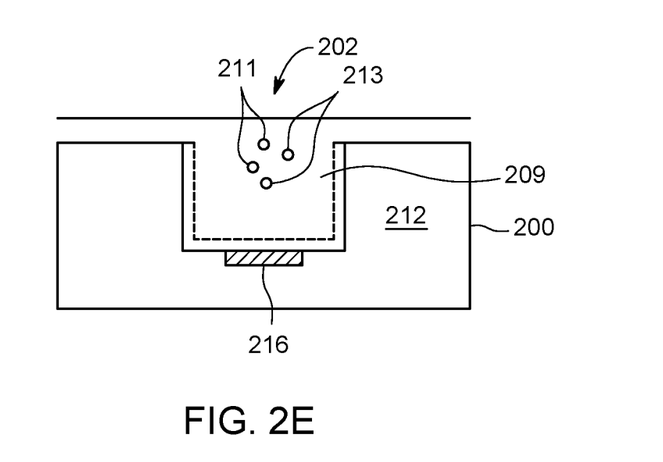

In embodiments, the high density PVD cobalt application reduces impurity, and promotes cobalt grain growth while enabling void-free cobalt gap-fill from the bottom of feature 202 up. As explained above with respect to FIG. 2D, the PVD treatment may be performed such that the feature is completely or substantially completely filled from the bottom to top. Alternatively, referring to 108 and FIG. 2E, the PVD treatment discussed above may be performed to only partially fill the feature and additional cobalt metal material 209 may be deposited on the substrate 200 and within the feature 202 in a CVD process chamber such as CVD process chambers 334 or 336 (FIG. 3) to completely fill the feature. In some embodiments, as shown in FIG. 2E, cobalt metal material 209 is deposited atop and/or within the feature 202. The cobalt metal material 209 may be deposited using any suitable CVD deposition process(es), such as those discussed above with respect to 102. Suitable cobalt materials includes cobalt material described above with respect to first cobalt layer 208. In some embodiments, cobalt metal material 209 is a conductive cobalt material used to fill the feature 202, for example, to form a conductive pathway.

In some embodiments, CVD application at 108, completely fills the feature from the bottom to top. In embodiments, CVD application at 108, overfills the one or more features as shown in FIG. 2E. In some embodiments, as shown in FIG. 2E, void(s) 211 and micro-voids 213 may be formed within cobalt metal material 209 as a result of the CVD deposition performed at 208. As such, at 110, the substrate and feature may be annealed to promote uniformity therein, removing void(s) 211 and micro-voids 213. Optional annealing processes include applying a temperature to the feature in an amount between about 50° C. and about 1400° C. (e.g., between about 50° C. and 500° C.; between about 100° C. and about 300° C.; between about 300° C. and 500° C. During the thermal annealing process, a gas mixture including at least a hydrogen containing gas and/or an inert gas (e.g., argon) is supplied into the chamber. The gas mixture may be supplied to the annealing chamber using either a static process where the chamber is filled with gas prior to the anneal process or a continuous flow process where the gas mixture is continuously flowed through the chamber during the anneal process.

In embodiments, the thermal annealing process 110 may be performed in-situ in the same processing chamber as the metal deposition process. The metal layer deposition and anneal may be performed in the same chamber if the CVD chamber such as chamber 336 (FIG. 3) has the capability to heat the substrate to temperatures for the anneal process as well as to provide the process gases as needed. Alternatively, the thermal annealing process may be performed in a separate processing chamber.

Figure 2F:
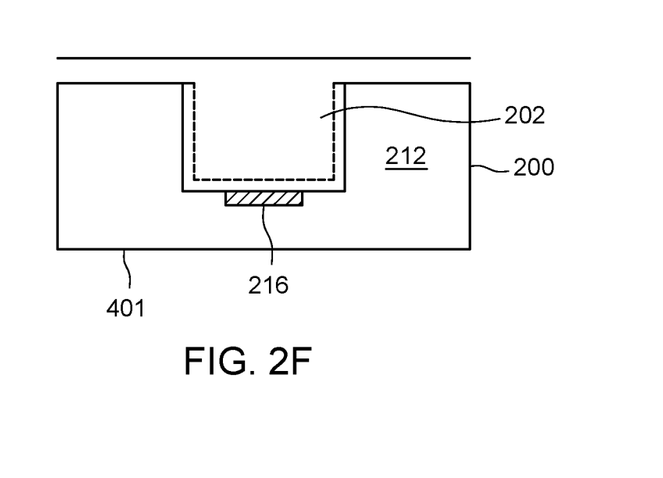

Referring to FIG. 2F, the feature 202 is shown filled with cobalt substantially free of voids and micro-voids. In embodiments, the feature 202 is devoid of voids and micro-voids. The substrate 200 can be further processed, for example, using chemical mechanical planarization (CMP) techniques known in the art to planarize the surface of a wafer 401 (e.g., to remove the excess cobalt overburden disposed atop the substrate and above the feature).

In some exemplary embodiments, a method for processing a substrate to fill a feature with cobalt includes depositing a first cobalt layer to a thickness of about 20 angstroms to about 150 angstroms via a chemical vapor deposition (CVD) process atop a substrate and within a feature disposed in the substrate. The feature is then at least partially filled with cobalt by performing a plasma process in a physical vapor deposition (PVD) chamber to reflow a portion of the first cobalt layer into the feature. The plasma process may further add a thickness of about 20 angstroms to about 150 angstroms, or about 60 angstroms to the feature. Additional cobalt can be deposited to a thickness of about 20 angstroms to about 150 angstroms via a second chemical vapor deposition (CVD) process into the feature, wherein the second CVD process completely fills the feature. The filled feature can then be annealed.

The methods described herein may be performed in individual process chambers that may be provided in a standalone configuration or as part of one or more cluster tools, for example, an integrated tool 300 (i.e., cluster tool) described below with respect to FIG. 3. In some embodiments, the method 100 of processing a substrate described above may be performed in individual process chambers provided as a standalone chamber or as part of a cluster tool. In embodiments, a cluster tool is configured for performing the methods for processing a substrate as described herein including: depositing a first cobalt layer via a chemical vapor deposition (CVD) process; at least partially filling the feature with cobalt by performing a plasma process in a physical vapor deposition (PVD) chamber; optionally depositing additional cobalt via a second chemical vapor deposition (CVD) process; and optionally annealing the filled feature. In some embodiments, the cluster tool can be configured for depositing only, and the anneal may be carried out in a separate chamber. In some embodiments, the anneal may be carried out in either of the PVD or the CVD process chamber.

Examples of the integrated tool 300 include the CENTURA® and ENDURA® integrated tools, available from Applied Materials, Inc., of Santa Clara, Calif. However, the methods described herein may be practiced using other cluster tools having suitable process chambers coupled thereto, or in other suitable process chambers. For example, in some embodiments the inventive methods discussed above may advantageously be performed in an integrated tool such that there are limited or no vacuum breaks while processing.

The integrated tool 300 can include two load lock chambers 306A, 306B for transferring of substrates into and out of the integrated tool 300. Typically, since the integrated tool 300 is under vacuum, the load lock chambers 306A, 306B may "pump down" the substrates introduced into the integrated tool 300. A first robot 310 may transfer the substrates between the load lock chambers 306A, 306B, and a first set of one or more substrate processing chambers 312, 314, 316, 318 (four are shown) coupled to a first central transfer chamber 350. Each substrate processing chamber 312, 314, 316, 318, can be outfitted to perform a number of substrate processing operations. In some embodiments, the first set of one or more substrate processing chambers 312, 314, 316, 318 may include any combination of PVD, ALD, CVD, etch, or degas chambers. For example, in some embodiments, the processing chambers 312, and 314 include a CVD and/or ALD process chamber configured to deposit titanium nitride such as underlayer 207.

The first robot 310 can also transfer substrates to/from two intermediate transfer chambers 322, 324. The intermediate transfer chambers 322, 324 can be used to maintain ultrahigh vacuum conditions while allowing substrates to be transferred within the integrated tool 300. A second robot 330 can transfer the substrates between the intermediate transfer chambers 322, 324 and a second set of one or more substrate processing chambers 332, 334, 335, 336, 338 coupled to a second central transfer chamber 355. The substrate processing chambers 332, 334, 335, 336, 338 can be outfitted to perform a variety of substrate processing operations including the method 100 described above in addition to, physical vapor deposition processes (PVD), chemical vapor deposition (CVD), etching, orientation and other substrate processes. In some embodiments, the second set of one or more substrate processing chambers 332, 334, 335, 336, 338 may include any combination of PVD, ALD, CVD, etch, or degas chambers. For example, in some embodiments, the substrate processing chambers 332, 334, 335, 336, 338 include three CVD chambers 334, 335, and 336, and two PVD chambers 332, and 338. Any of the substrate processing chambers 312, 314, 316, 318, 332, 334, 335, 336, 338 may be removed from the integrated tool 300 if not necessary for a particular process to be performed by the integrated tool 300.

Embodiments of the present disclosure include, an apparatus for film deposition on a substrate, comprising: a central vacuum transfer chamber such as chamber 350 or 355; a chemical vapor deposition (CVD) and/or Atomic Layer Deposition (ALD) process chamber such as chambers 312 and/or 314 configured to deposit titanium nitride and coupled to the central vacuum transfer chamber; a chemical vapor deposition (CVD) process chamber such as chambers 334, and/or 335 configured to deposit cobalt and cobalt containing materials as described herein coupled to the central vacuum transfer chamber; and a physical vapor deposition (PVD) chamber such as chambers 332 and 338 configured to reflow and/or deposit cobalt and cobalt containing materials as described herein and coupled to the central vacuum transfer chamber 350 and/or 355.

The disclosure may be practiced using other semiconductor substrate processing systems wherein the processing parameters may be adjusted to achieve acceptable characteristics by those skilled in the art by utilizing the teachings disclosed herein without departing from the spirit of the disclosure. While the foregoing is directed to embodiments of the present disclosure, other and further embodiments of the disclosure may be devised without departing from the basic scope thereof.

The invention claimed is:

1. A method for processing a substrate, comprising:
   depositing a first cobalt layer via a chemical vapor deposition (CVD) process atop a substrate and within a feature disposed in the substrate; and
   at least partially filling the feature with cobalt by performing a plasma process in a physical vapor deposition (PVD) chamber having a cobalt target to reflow a portion of the first cobalt layer into the feature.

2. The method of claim 1, wherein the plasma process includes depositing cobalt within the feature from a cobalt target disposed in the PVD chamber.

3. The method of claim 1, further comprising:
   depositing an underlayer within the feature prior to depositing the first cobalt layer, and depositing the first cobalt layer directly atop the underlayer.

4. The method of claim 3, wherein the underlayer comprises titanium nitride.

5. The method of claim 4, wherein the titanium nitride has a thickness of about 2 angstroms to about 20 angstroms.

6. The method of claim 1, wherein the plasma process is performed at a temperature of about 350° C. to about 500° C.

7. The method of claim 1, wherein the plasma process comprises a plasma formed from hydrogen or an inert gas.

8. The method of claim 1, wherein the plasma process comprises a plasma formed from one or more of argon, krypton, or neon.

9. The method of claim 1, wherein the feature is completely filled during the plasma process.

10. The method of claim 9, further comprising:
    annealing by applying a temperature in an amount between about 50° C. and about 1400° C. to the feature.

11. The method of claim 1, wherein the feature is only partially filled during the plasma process, and further comprising:
    subsequently depositing a second cobalt layer via a CVD process to completely fill the feature.

12. The method of claim 11, further comprising:
    annealing by applying a temperature in an amount between about 50° C. and about 1400° C. to the feature.

13. The method of claim 1, wherein the feature has a width less than or equal to 15 nm.

14. The method of claim 1, wherein the first cobalt layer is deposited to a thickness of about 20 angstroms to about 150 angstroms.

15. A method for processing a substrate, comprising:
    depositing an underlayer within a feature disposed in a substrate;
    depositing a first cobalt layer via a chemical vapor deposition (CVD) process atop the substrate and directly atop the underlayer;
    partially filling the feature with cobalt by performing a plasma process in a physical vapor deposition (PVD) chamber to reflow a portion of the first cobalt layer into the feature while simultaneously depositing cobalt within the feature from a cobalt target disposed in the PVD chamber; and
    subsequently depositing a second cobalt layer via a CVD process to completely fill the feature.

16. The method of claim 15, further comprising:
    annealing by applying a temperature in an amount between about 50° C. and about 1400° C. to the feature.

17. The method of claim 15, wherein the plasma process is performed at a temperature of about 350° C. to about 500° C.

* * * * *